United States Patent
Nurmela et al.

(10) Patent No.: US 11,233,498 B2
(45) Date of Patent: Jan. 25, 2022

(54) BRAGG MIRROR, RESONATOR AND FILTER DEVICE

(71) Applicant: Huawei Technologies Co., Ltd., Shenzhen (CN)

(72) Inventors: Arto Turo Ilmari Nurmela, Kista (SE); Jian Gu, Chengdu (CN); Xiang Wei, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 287 days.

(21) Appl. No.: 16/502,932

(22) Filed: Jul. 3, 2019

(65) Prior Publication Data
US 2019/0326881 A1   Oct. 24, 2019

Related U.S. Application Data

(63) Continuation of application No. PCT/EP2017/050203, filed on Jan. 5, 2017.

(51) Int. Cl.
*H03H 9/17* (2006.01)
*H03H 9/13* (2006.01)

(52) U.S. Cl.
CPC .......... *H03H 9/17* (2013.01); *H03H 9/13* (2013.01)

(58) Field of Classification Search
CPC .......... H03H 9/19; H03H 9/13; H03H 9/0514; H03H 9/02023
See application file for complete search history.

(56) References Cited

U.S. PATENT DOCUMENTS

| | | |
|---|---|---|
| 7,561,009 B2 | 7/2009 | Larson, III et al. |
| 8,456,257 B1 | 6/2013 | Fattinger |
| 9,083,302 B2 | 7/2015 | Burak et al. |

(Continued)

FOREIGN PATENT DOCUMENTS

| | | |
|---|---|---|
| CN | 101083456 A | 12/2007 |
| CN | 101931380 A | 12/2010 |

(Continued)

OTHER PUBLICATIONS

Kaitila et al., "Spurious Resonance Free Bulk Acoustic Wave Resonators," 2003 IEEE Ultrasonics Symposium, pp. 84-87, Institute of Electrical and Electronics Engineers—New York, New York (Oct. 5-8, 2003).

(Continued)

Primary Examiner — Jeffrey M Shin
(74) Attorney, Agent, or Firm — Leydig, Voit & Mayer, Ltd.

(57) ABSTRACT

Disclosed is a Bragg mirror, a resonator and a filter device comprised thereof. The Bragg mirror comprises a stack of plurality of layers arranged in an axial direction, wherein the plurality of layers comprises at least one first layer comprising, in a radial direction, a first material and a second material, wherein the first material is a first metal and the second material is a different material with respect to the first material, and wherein the first material is radially embedded by the second material in the first layer, or vice versa. The resonator comprises a top electrode, a bottom electrode, a piezo electric layer arranged between the top electrode and the bottom electrode, a substrate, and a Bragg mirror arranged between the bottom electrode and the substrate.

15 Claims, 9 Drawing Sheets

(56) References Cited

U.S. PATENT DOCUMENTS

| | | | |
|---|---|---|---|
| 2010/0005654 A1* | 1/2010 | Hart | H03H 9/589 |
| | | | 29/847 |
| 2011/0080233 A1 | 4/2011 | Petit et al. | |
| 2012/0194297 A1 | 8/2012 | Choy et al. | |
| 2013/0038408 A1 | 2/2013 | Burak et al. | |
| 2014/0118092 A1 | 5/2014 | Burak et al. | |
| 2014/0292152 A1 | 10/2014 | Gammel et al. | |
| 2015/0094000 A1 | 4/2015 | Aigner et al. | |

FOREIGN PATENT DOCUMENTS

| | | | |
|---|---|---|---|
| CN | 103891139 A | 6/2014 | |
| CN | 104633372 A | 5/2015 | |
| JP | 2008211394 A | 9/2008 | |
| WO | 2005043756 A1 | 5/2005 | |

OTHER PUBLICATIONS

Kumar et al., "Design of a New Step-like Frame FBAR for Suppression of Spurious Resonances," Radioengineering, vol. 22, No. 3, pp. 687-693, (Sep. 2013).

Park et al., "Advanced Lateral Structures of BAW Resonator for Spurious Mode Suppression," Proceedings of the 42nd European Microwave Conference, pp. 104-107, Amsterdam, Netherlands (Oct. 29-Nov. 1, 2012).

* cited by examiner

BRAGG MIRROR, RESONATOR AND FILTER DEVICE

CROSS-REFERENCE TO RELATED APPLICATIONS

This application is a continuation of International Application No. PCT/EP2017/050203, filed on Jan. 5, 2017, the disclosure of which is hereby incorporated by reference in its entirety.

TECHNICAL FIELD

The disclosure relates to a Bragg mirror and a resonator comprising such a Bragg mirror. Furthermore, the disclosure also relates to a filter device comprising such a resonator.

BACKGROUND

Resonators are used in the front ends of wireless communication devices and nodes for radio frequency filtering. In the GHz frequency area, Solidly Mounted Resonator-Bulk Acoustic Wave (SMR-BAW) resonators may be applied. The active part of the SMR-BAW resonator consists of a top electrode, a piezo layer, and a bottom electrode. The active part is placed on a substrate. To acoustically isolate the active part of the SMR-BAW resonator from the substrate, the active layers are placed on a Bragg mirror. Layers of materials with high and low acoustic impedance alternate in the Bragg mirror creating a layer stack which reflects acoustic waves back to the active part. This may be referred to as an acoustic Bragg mirror. Typically, the Bragg mirror consists of alternating Silicon dioxide ($SiO_2$) having a low acoustic impedance and tungsten (W) having a high acoustic impedance layers.

The properties of the materials used in the Bragg mirror are sensitive to ambient and intrinsic temperature variations. The temperature is therefore one of the fundamental factors affecting the performance of the Bragg mirror and thereby the performance of the SMR-BAW resonator. More specifically, temperature variations affect the resonance frequencies in the SMR-BAW resonator and consequently also the centre frequency, bandwidth and performance of a SMR-BAW filter which uses the SMR-BAW resonator. Conventional solutions to compensate this effect are based on adding two or more $SiO_2$ layers into the layer stack of the SMR-BAW resonator. $SiO_2$ has a positive temperature coefficient of frequency (TCF) near room temperature, which means that $SiO_2$ stiffens with increased temperature. The adequate amount of added $SiO_2$ layer stiffens the layer stack so that the TCF of the resonator can get close to zero. This solution provides sufficient temperature compensation in SMR-BAW resonators employed in applications where the applied signal levels are well below 1 Watt. However, in new applications for SMR-BAW resonators, e.g. in the front-ends of base stations, increased signal levels are applied. The increased signal levels induce increased temperature in the SMR-BAW resonators, which leads to higher demands on the temperature compensation.

Another factor affecting the performance of the SMR-BAW resonator is spurious resonances. Spurious resonances close to resonance frequencies of the SMR-BAW resonator suppress the bandwidth and increase the insertion loss of the SMR-BAW resonator. Typically, these spurious resonances emerge as standing shear waves. Conventional solutions to suppress spurious resonances are based on adding a ring covering the top electrode edges or designing the top electrode shape so that there are no 90° angles.

SUMMARY

An objective of embodiments of the disclosure is to provide a solution which mitigates or solves the drawbacks and problems of conventional solutions.

Another objective of embodiments of the disclosure is to provide a solution which provides a Bragg mirror with improved acoustic isolation capability.

The above and further objectives are solved by the subject matter of the independent claims. Further advantageous implementation forms of the disclosure can be found in the dependent claims.

According to a first aspect of the disclosure, the above mentioned and other objectives are achieved with a Bragg mirror comprising a stack of a plurality of layers arranged in an axial direction, wherein the plurality of layers comprises at least one first layer comprising, in a radial direction, a first material and a second material, wherein the first material is a first metal and the second material is a different material with respect to the first material, and wherein the first material is radially embedded by the second material in the first layer, or wherein the second material is radially embedded by the first material in the first layer.

The axial direction is herein a first direction along an axis through the layer stack (i.e. the stack of the plurality of layers), e.g. from the bottom of the layer stack to the top of the layer stack passing through the layers of the layer stack. The axial direction may also be denoted as a stacking direction, i.e. in the direction of the layer stack. The radial direction is herein a second direction along the plane of the layers, i.e. orthogonal to the first direction. The radial direction may be interpreted as extending radially outwards from the axis of the first direction. Radial and axial are to be understood as directions relative to each other, and not necessarily imposing any particular shapes such as regular shapes.

Furthermore, a layer is herein understood to mean a substantially planar structure. For example, the thickness is small compared with the other dimensions. Further, the layer has surfaces that are parallel. The layer is preferably continuous in the radial direction. A layer has given material characteristics.

The terms "first" and "second" etc. as applied to layers are descriptive labels, and should not be interpreted to indicate the position of the layer in the layer stack. Thus, the first layer can be positioned at the top of the layer stack but it could also be positioned at any other position in the layer stack. There may be more than one first layer. In this context, the top of the layer stack indicates an outermost layer, which may be used for positioning against other surfaces, such as those of a bottom electrode in a resonator.

A material is radially embedded if it is surrounded by the other material in the radial direction. The material that is embedded is referred to as the embedded material. The material that surrounds the embedded material is the embedding material.

Herein, materials may be considered different to each other by being different elements or compounds, and/or having different material properties. As regards material properties, this refers to one or more of acoustic velocities, acoustic impedance, and heat transfer properties.

A Bragg mirror according to the first aspect provides a number of advantages over conventional solutions. One such advantage is that the Bragg mirror provides simultaneous temperature compensation and suppression of spurious resonances. Hence, the acoustic isolation capability of the Bragg mirror is improved. The simultaneous temperature compensation and spurious suppression is achieved with the first layer, which both improves the transfer of heat energy through the Bragg mirror and hinders propagation of lateral waves through the Bragg mirror. The temperature handling is enhanced if the embedding material is the metal.

In a first possible implementation form of a Bragg mirror according to the first aspect, a ratio of an acoustic velocity of the first material to an acoustic velocity of the second material is less than 0.94 or larger than 1.06.

According to the first implementation form, the acoustic velocity of the first material should differ from the acoustic velocity of the second material so that the above stated ratio holds. This leads to a mismatch in the acoustic wave lengths through the different materials. This mismatch hinders the propagation of lateral waves outside the Bragg mirror.

In a second possible implementation form of a Bragg mirror according to the first implementation form of the first aspect or to the first aspect as such, a ratio of an acoustic impedance of the first material to an acoustic impedance of the second material is between 0.5 to 2.0.

The Bragg mirror is formed by the alternating layers with low and high acoustic impedance to reflect acoustic waves. The second implementation form provides that the acoustic impedance of the first material is close enough to the acoustic impedance of the second material to be applied in the same layer, the first layer.

In a third possible implementation form of a Bragg mirror according to any of the preceding implementation forms of the first aspect or to the first aspect as such, the embedding material forms a loop surrounding the embedded material, and the embedded material forms an inner filling of the loop.

The third implementation form provides a mismatch in the acoustic waves through the embedding material and the embedded material in the first layer. This mismatch hinders lateral waves to propagate through the Bragg mirror. The loop may be any shape that wholly surrounds the embedded material in the radial direction.

In a fourth possible implementation form of a Bragg mirror according to any of the preceding implementation forms of the first aspect or to the first aspect as such, the plurality of layers comprises at least one second layer comprising a third material, and at least one third layer comprising the first material.

The fourth implementation form provides improved reflection in the Bragg mirror and thereby less energy loss.

In a fifth possible implementation form of a Bragg mirror according the fourth implementation form of the first aspect, the third material is a second metal.

Metals typically have high thermal conductivity. By using metal layers in the Bragg mirror, heat energy can be transferred through the Bragg mirror in an efficient manner.

In a sixth possible implementation form of a Bragg mirror according to the fifth implementation form of the first aspect, the first material is aluminium, the second material is silicon dioxide, and the third material is tungsten.

Aluminum and silicon dioxide have acoustic impedance values which are close to each other, whereas tungsten has a higher acoustic impedance value. Both aluminum and tungsten have high thermal conductivity. Hence, the materials according to the sixth implementation form have properties that fulfil the criteria to achieve simultaneous temperature compensation and suppression of spurious resonances.

In a seventh possible implementation form of a Bragg mirror according to any of fourth to sixth implementation form of the first aspect, the plurality of layers further comprises a plurality of said second layers and a plurality of said third layers, wherein the plurality of second layers and the plurality of third layers are alternatingly arranged in the stack of the Bragg mirror.

The seventh implementation form provides higher reflectivity in the Bragg mirror. With more layers a higher reflectivity is achieved in the Bragg mirror resulting in lower energy loss of the particular wavelengths.

In an eighth possible implementation form of a Bragg mirror according to the seventh implementation form of the first aspect, the plurality of second layers and the plurality of third layers are alternatingly arranged below the first layer in the Bragg mirror.

The arrangement of the layers according to the eighth possible implementation form provides strong spurious suppression when the Bragg mirror is used in a resonator.

According to a second aspect of the disclosure, the above mentioned and other objectives are achieved with a resonator comprising:
a top electrode,
a bottom electrode,
a piezo electric layer arranged between the top electrode and the bottom electrode,
a substrate, and
a Bragg mirror according to any of the preceding implementation forms of the first aspect or the first aspect as such, wherein the Bragg mirror is arranged between the bottom electrode and the substrate.

The top and bottom electrodes extend in the radial plane, creating a top electrode layer and bottom electrode layer which are perpendicular to the axial direction of the resonator. Also the piezo electric layer extends in the radial plane parallel with the top and bottom electrodes.

A resonator according to the second aspect provides a number of advantages over conventional solutions. One such advantage is that the resonator provides simultaneous temperature compensation and suppression of spurious resonances. The temperature compensation is achieved with an efficient transfer of heat through the Bragg mirror to the substrate and spurious resonances are suppresses by hindering lateral waves to propagate through the Bragg mirror.

In a first possible implementation form of a resonator according to the second aspect, (a projection of) the top electrode in the axial direction overlaps the embedded material.

In one example of the first implementation form, the top electrode layer overlaps the embedded material wholly, while the embedded material partly covers the top electrode.

The first implementation form thereby provides a surface area of the top electrode which is not covered by the embedded material, said surface area enables spurious resonance suppression inside the resonator.

In a second possible implementation form of a resonator according to any of the preceding implementation forms of the second aspect or to the second aspect as such, the bottom electrode abuts the embedded material.

The arrangement of the embedded material according to the second possible implementation form provides strong spurious suppression in the resonator.

In a third possible implementation form of a resonator according to any of the preceding implementation forms of the second aspect or to the second aspect as such, a shape of the embedded material is the same shape as a shape of the top electrode.

The third implementation form provides a uniform spurious suppression in the resonator. When the shape of the of the embedded material is the same shape as a shape of the top electrode the spurious suppression is equal in all the edges of the resonator.

In a fourth possible implementation form of a resonator according to the third implementation form of the second aspect, the same shape is a polygon.

The fourth implementation form also provides a uniform spurious suppression in the resonator.

In a fifth possible implementation form of a resonator according to any of the preceding implementation forms of the second aspect or to the second aspect as such, a surface area of the embedded material abutting the bottom electrode is less than a surface area of the top electrode.

The fifth implementation form provides a surface area of the top electrode which is not covered by the embedded material, said surface area enables spurious suppression inside the resonator.

In a sixth possible implementation form of a resonator according to the fifth implementation form of the second aspect, the surface area of the embedded material is between 67% to 98% of the surface area of the top electrode.

The sixth implementation form provides a spurious suppression area inside the resonator which efficiently suppresses spurious resonances.

In a seventh possible implementation form of a resonator according to any of the preceding implementation forms of the second aspect or to the second aspect as such, the top electrode and the embedded material in the Bragg mirror are axially aligned relative to each other.

That the top electrode and the embedded material are axially aligned is herein understood to mean that a centre point of the top electrode and a centre point of the embedded material are aligned in the axial direction.

The seventh implementation form provides a uniform spurious suppression in the resonator.

In an eighth possible implementation form of a resonator according to any of the preceding implementation forms of the second aspect or to the second aspect as such, the top electrode, the bottom electrode, the piezo electric layer, and the embedded material in the Bragg mirror are axially aligned relative to each other.

The eighth implementation form provides a uniform spurious suppression in the resonator.

In a ninth possible implementation form of a resonator according to the any of the preceding implementation forms of the second aspect or to the second aspect as such, the bottom electrode abuts the first layer.

The arrangement of the first layer according to the ninth possible implementation form provides strong spurious suppression in the resonator.

According to a third aspect of the disclosure, the above mentioned and other objectives are achieved with a filter device comprising
an input configured to receive an input signal,
an output configured to output a filtered output signal,
at least one resonator according to any of the preceding implementation forms of the second aspect or to the second aspect as such.

A filter device according to the third aspect provides a number of advantages over conventional solutions. One such advantage is an improved performance of the filter device due to the simultaneous temperature compensation and spurious suppression in the at least resonators.

Further applications and advantages of embodiments of the present invention will be apparent from the following detailed description.

BRIEF DESCRIPTION OF THE DRAWINGS

The appended drawings are intended to clarify and explain different embodiments of the present invention, in which.

DETAILED DESCRIPTION

In a resonator, the Bragg mirror is used to acoustically isolate the active part of the resonator from a substrate of the resonator. The properties of the materials used in the Bragg mirror are sensitive to temperature variations. Temperature variations, such as increased temperature due to high signal levels in the resonator, will therefore affect the performance of the Bragg mirror and thereby the performance of the resonator. Consequently, to achieve high performance the Bragg mirror should be able to compensate for effects caused by such variations in temperature. Conventional temperature compensation solutions are based on compensating the effect of the softening of the materials due to temperature increases. These solutions can decrease the nonlinear effects in resonators where the applied signal levels are well below 1 Watt. However, they are not able to provide sufficient temperature compensation at higher signal levels. Another problem with conventional temperature compensation solutions are that they do not offer a way to transfer heat energy or to cool the resonator. This leads to high temperatures in the resonator which decreases the lifetime of the resonator.

Another factor affecting the performance of resonators is spurious resonances, usually emerging as standing shear waves. As aforementioned, conventional solutions to suppress spurious resonances are based on adding a ring covering the top electrode edges or designing the top electrode shape so that there are no 90° angles. These solutions focus on suppressing shear waves and do not offer a way to transfer heat energy or to cool the resonator.

Consequently, an improved temperature compensation solution is needed which also suppresses spurious resonances and increases the lifetime of resonators. Embodiments of the disclosure provides such an improved solution.

Figure 1:
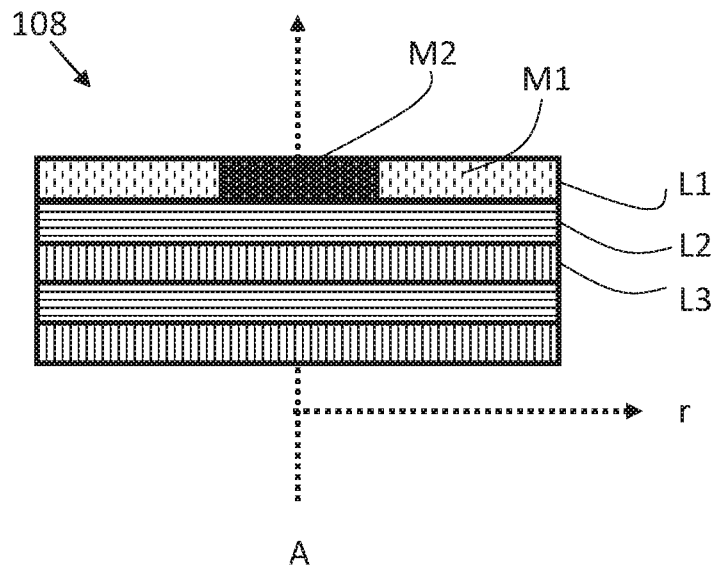
FIG. 1 shows a cross section of a Bragg mirror according to an example of the disclosure.

In an embodiment of the disclosure improved handling of increased temperatures and spurious resonances is provided with a Bragg mirror, such as the Bragg mirror 108 shown in FIG. 1. The Bragg mirror 108 in FIG. 1 comprises a stack of a plurality of layers arranged in an axial direction A, also denoted as a stacking direction. FIG. 1 shows a cross section of the Bragg mirror 108 to illustrate the layer structure of the Bragg mirror 108. The plurality of layers in the layer stack comprises at least one first layer L1 in a radial direction r, orthogonal to the axial direction A and extending outwards from the axis A. The first layer L1 comprises a first material M1 and a second material M2. The first material M1 is a first metal and the second material M2 is a different material with respect to the first material M1. Furthermore, the first material M1 is radially embedded by the second material M2 in the first layer L1, or alternatively the second material M2 is radially embedded by the first material M1 in the first layer L1. FIG. 1 shows the alternative where the second material M2 is radially embedded by the first material M1. In this alternative, the first material M1 surrounds the second material M2, such that the first material M1 forms a loop around the second material M2 and the second material M2 becomes an inner filling of the loop.

In addition to the at least one first layer L1, the plurality of layers in the Bragg mirror 108 in FIG. 1 comprises at least one second layer L2 and at least one third layer L3. Typically, a plurality of second layers L2 and a plurality of third layers L3 would be used in the Bragg mirror 108. The plurality of second layers L2 and the plurality of third layers L3 are in one embodiment alternatingly arranged, as shown in FIG. 1.

FIG. 1 shows the example of the Bragg mirror 108 comprising one first layer L1, two second layers L2 and two third layers L3. Whereas the number of layers can be arbitrary and depend on the implementation. Nevertheless it may be advantageous to choose the number of second layers L2 and the number of third layers L3 to be the same as shown in the embodiment of FIG. 1. Further, in FIG. 1, the first layer L1 is positioned at the top of the layer stack, with the plurality of second layers L2 and the plurality of third layers L3 alternatingly arranged below the first layer L1 on a substrate (not shown in FIG. 1). However, the disclosure is not limited to this embodiment. The Bragg mirror 108 could comprise any number of the different layers L1, L2, L3, e.g. have more than one first layer L1. In addition, the layers L1, L2, L3 can be flexibly arranged in the layer stack of the Bragg mirror 108, meaning that the position of the at least one first layer L1 could be anywhere in the layer stack, at the top, at the bottom, or between any of the plurality of layers. In the same way, the plurality of second layers L2 and the plurality of third layers L3 can be flexibly arranged and moved in relation to the at least one first layer L1, as long as they are alternatingly arranged with each other.

In the embodiment of FIG. 1 all the layers in the layer stack have the same thickness, i.e. the same height in the axial direction. However, in other embodiments the layers can have different thickness such that each layer has its own thickness. The cross section of the layers can have a rectangular form, as shown in FIG. 1, or they can have a trapezoidal form. When the cross section of a layer has a trapezoidal form the angled edge area of the layer is small compared to the total width of the layer.

The materials used in the different layers L1, L2, L3 of the Bragg mirror 108 are selected based on their acoustic characteristics, such as the acoustic velocity and the acoustic impedance of the materials. As in conventional Bragg mirrors, the second layer L2 and the third layer L3 should comprise materials that have different acoustic impedance. This means that if the material in the second layer L2 has low acoustic impedance then the material in the third layer L3 should have high acoustic impedance. The acoustic impedance depends on the density of the material through which the acoustic waves travel. If there is a change in the density of the material, there will be reflections of the acoustic waves. Hence, it is this difference in acoustic impedance between the layers in the Bragg mirror 108 which cause reflections of acoustic waves and thereby provides the acoustic isolation of the Bragg mirror 108.

The first material M1 and the second material M2 in the first layer L1 can have approximately the same acoustic impedance values but (preferably significantly) different velocities of sounds. When the first material M1 and the second material M2 have approximately the same acoustic impedance values they can be comprised in the same layer without adversely affecting the reflecting properties of the Bragg mirror 108. The criteria that the first material M1 and the second material M2 should have different velocities of sounds leads to a mismatch in the acoustic waves through the different materials. This mismatch hinders lateral waves to propagate between the area of the first material M1 and the area of the second material M2 in the first layer, thereby supressing spurious resonances.

The criteria related to the acoustic impedance is expressed as a ratio between the acoustic impedance of the first and second materials M1, M2. In an embodiment, the ratio of the acoustic impedance of the first material M1 to the acoustic impedance of the second material M2 is between 0.5 to 2.0. The criteria related to the acoustic velocity is expressed as a ratio between the acoustic velocity of the first and second materials M1, M2. In an embodiment, the ratio of the acoustic velocity of the first material M1 to the acoustic velocity of the second material M2 is less than 0.94 or larger than 1.06.

Figure 2:
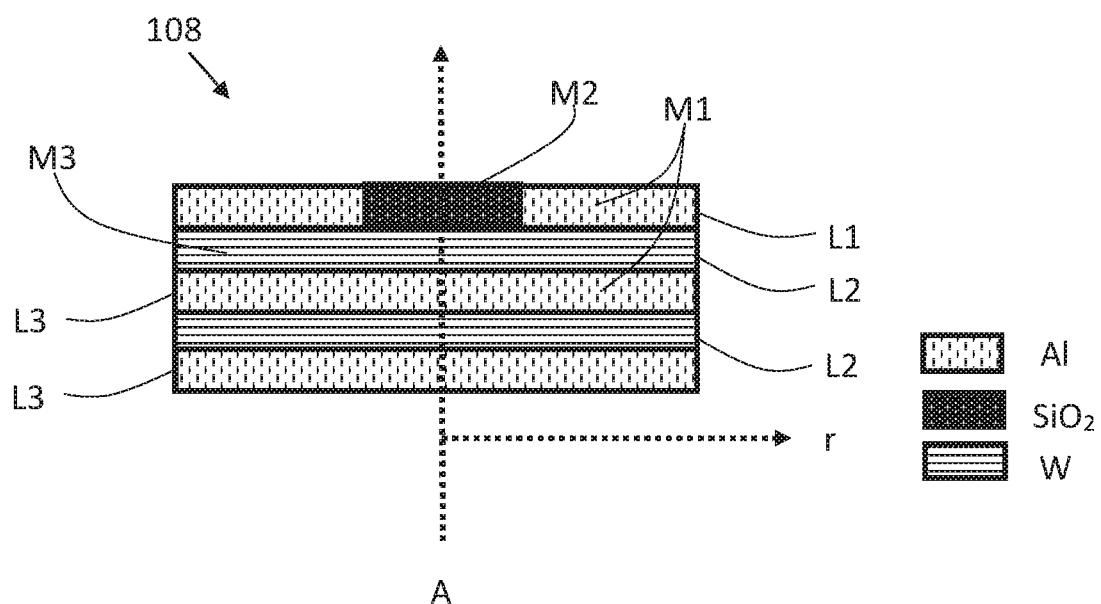
FIG. 2 shows a cross section of a Bragg mirror according to another example of the disclosure.

One example of a combination of materials which fulfils the criteria described above is shown in FIG. 2. In FIG. 2, the first layer L1 comprises the first material M1 and the second material M2, while the plurality of second layers L2 comprise the third material M3 and the plurality of third layers L3 comprise the first material M1. The first material M1 and the third material M3 are both selected to be metals. This ensures a good transfer of heat energy through the Bragg mirror 108, as metal has high thermal conductivity. The first material M1 is a first metal and the third material M3 is a second metal. The second metal is different from the first metal and has a different acoustic impedance than the first metal. The second material M2 is different from the first material M1 and has a different acoustic velocity than the first material M1. More specifically, the first material M1 may be aluminium Al, the second material M2 may be silicon dioxide $SiO_2$, and the third material M3 may be tungsten W, as shown in FIG. 2. Aluminium Al is a metal with a low acoustic impedance value, having an acoustic impedance value of $17.3 \times 10^6$ kg/m$^2$s, while tungsten W is a metal with a high acoustic impedance value, having an acoustic impedance of $101 \times 10^6$ kg/m$^2$s. Silicon dioxide $SiO_2$ has an acoustic impedance value, i.e. $13.1 \times 10^6$ kg/m$^2$s, which is close to that of aluminium Al but has an acoustic velocity, i.e. 5970 m/s, which is lower than that of aluminium Al, i.e. 6422 m/s. Consequently, using said materials the criteria related to acoustic impedance and acoustic velocity described above are fulfilled, resulting in a Bragg mirror with improved temperature compensation and improved transfer of heat energy.

Figure 3:
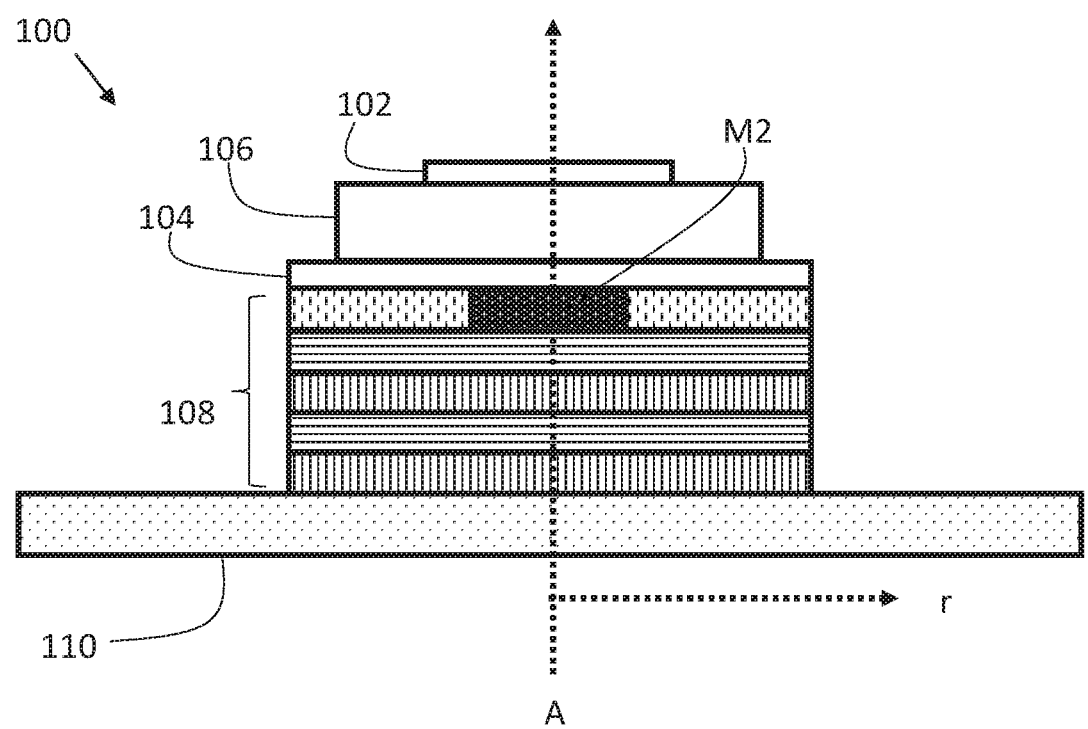
FIG. 3 shows a cross section of a resonator according to an example of the disclosure.

In one embodiment of the disclosure the Bragg mirror 108 is used in a resonator, such as the resonator 100 shown in FIG. 3. The resonator 100 comprises a top electrode 102, a bottom electrode 104, and a piezo electric layer 106 arranged between the top electrode 102 and the bottom electrode 104. Together these three parts constitute the active part of the resonator 100. The top and bottom electrode layers 102, 104 may consist of molybdenum Mo, tungsten W, platinum Pt, titanium Ti, ruthenium Ru, iridium Ir, aluminum Al, or other suitable electrode materials. The piezoelectric layer may consist of aluminium nitride AlN, scandium aluminium nitride $Sc_XAl_{X-1}N$ (where X is between 0.01 and 0.5), zinc oxide ZnO, or other suitable piezoelectric materials. The resonator 100 further comprises a Bragg mirror 108, as for example shown and described in relation to FIGS. 1 and 2, and a substrate 110. The Bragg mirror 108 is arranged between the active part and the substrate 110, to acoustically isolate the active part from the substrate 110. The top electrode 102, the bottom electrode 104, the piezo electric layer 106, and the embedded material M1; M2 (M1 or M2, as applicable, hereafter M1; M2) in the Bragg mirror 108 are axially aligned relative to each other. This means that a central region of said parts are aligned in the axial direction, as shown in FIG. 3.

Figure 4:
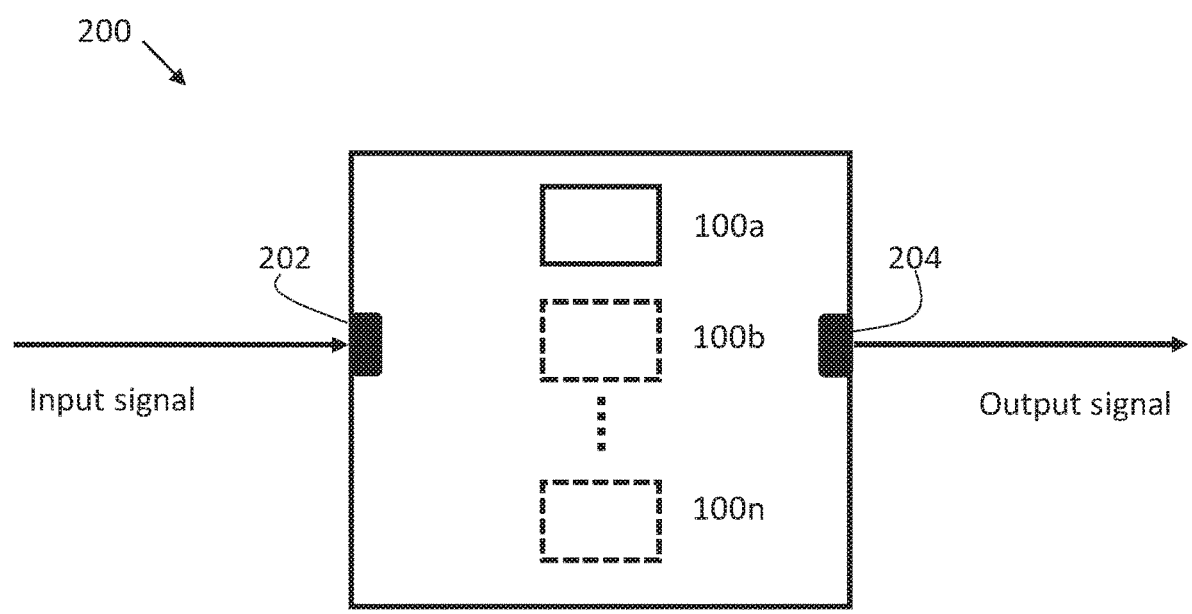
FIG. 4 shows a filter device according to an example of the disclosure.

The resonator 100 is in one embodiment used in a filter device, such as the filter device 200 shown in FIG. 4. The filter device 200 comprises an input 202 configured to receive an input signal and an output 204 configured to output a filtered output signal. The filter device 200 further comprises at least one resonator 100 according to any of the herein described embodiments. The input signal is filtered using one or more resonators 100a, 100b, . . . , 100n as illustrated in FIG. 4. Each resonator 100a, 100b, . . . , 100n has two resonance frequencies and in one embodiment the filter device 200 comprises resonators with two different resonance frequency sets.

Further details on the structure of the resonator 100 and the relationship between the Bragg mirror 108 and the active part of the resonator 100 will now be described with reference to FIGS. 5-8.

Figure 5:
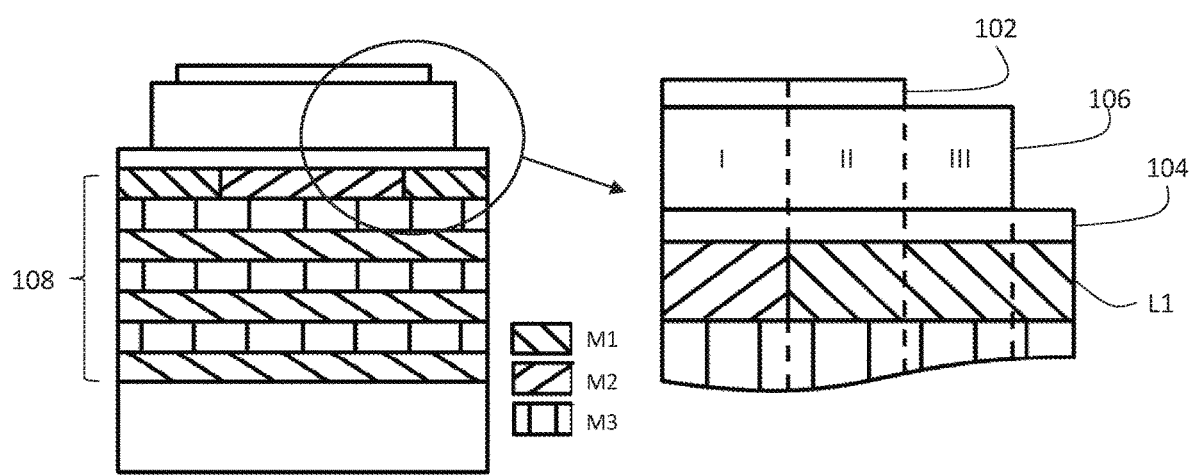
FIG. 5 shows a close up of the cross section of the active part of the resonator and the top of the Bragg mirror.

FIG. 5 shows the position of the first and second materials M1, M2 in the first layer L1 relative to the active part of the resonator 100 according to one embodiment. The first layer L1 is in this embodiment placed at the top of the Bragg mirror 108 directly under the active part of the resonator 100. In this embodiment, the bottom electrode 104 therefore abuts the first layer L1 and thereby also the embedded material in the first layer L1. Hence, the bottom electrode 104 is in physical contact with the first layer L1. The embedded material in FIG. 5 is the second material M2. The second material M2 is axially positioned below the top electrode 102 and covering a smaller area than the top electrode 102, i.e. area I in FIG. 5. Meaning that the first material M1 in the first layer L1 spans the periphery area of the top electrode 102, i.e. the outer area closest to the edge of the top electrode, denoted area II in FIG. 5. The first material M1 also covers the area outside the top electrode 102, i.e. area III in FIG. 5. The benefit of arranging the materials M1, M2 in the first layer L1 in this way is that spurious resonances are suppressed, as will be described in more detail in relation to FIG. 9 below.

Figure 6:
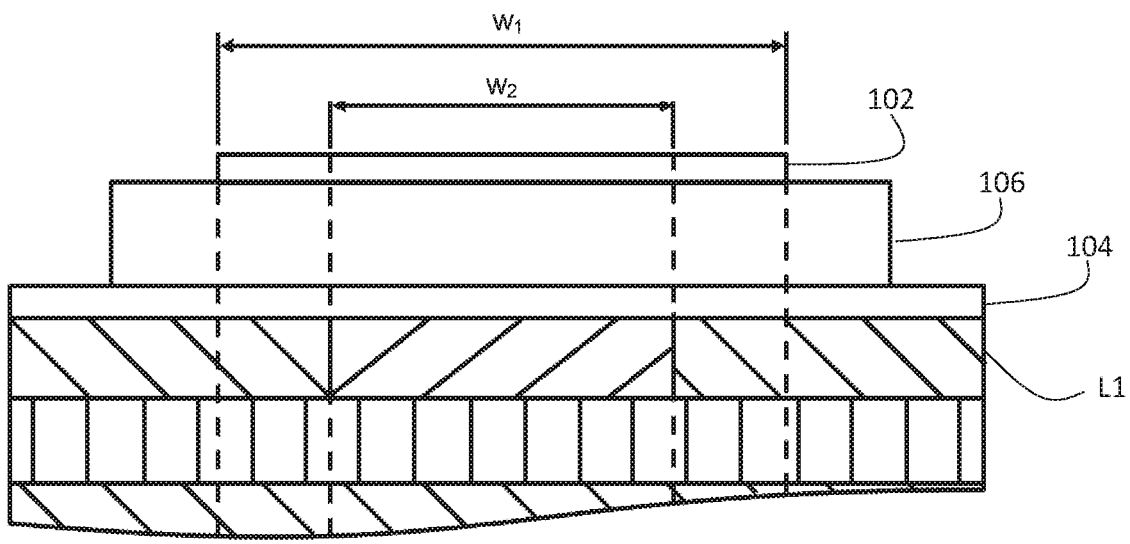
FIG. 6 shows a cross section of the active part of the resonator and the top of the Bragg mirror.

Each layer in the resonator 100 extends in the radial direction and the width of the extension in the radial direction is herein denoted the width w of the layer. The width w can also refer to the width in the radial direction of the embedded material within the first layer. FIG. 6 shows the relationship between the width w1 of the top electrode 102 and the width w2 of the embedded material M1; M2. The width w2 of the embedded material M1; M2 in the first layer L1 may vary from 60% to 150% of the width w1 of the top electrode 102. Hence, the width w2 of the embedded material M1; M2 can be either narrower than the width $w_1$ of the top electrode 102 or wider than the width w1 of the top electrode 102. In the embodiment shown in FIG. 6, the width $w_2$ of the embedded material M1; M2 is narrower than the width $w_1$ of the top electrode 102.

A similar relationship to the width relationship exists between the surface area of the embedded material M1; M2 and the surface area of the top electrode 102. Meaning that the surface area of the embedded material M1; M2 can be either more or less than the surface area of the top electrode 102. The surface area is herein understood to mean the area of surface of the layer, or of the material M1; M2 within the layer, in the radial plane. In one embodiment the surface area of the embedded material M1; M2 is less than the surface area of the top electrode 102. In a more specific embodiment, the surface area of the embedded material is between 67% to 98% of the surface area of the top electrode 102.

Figure 7:
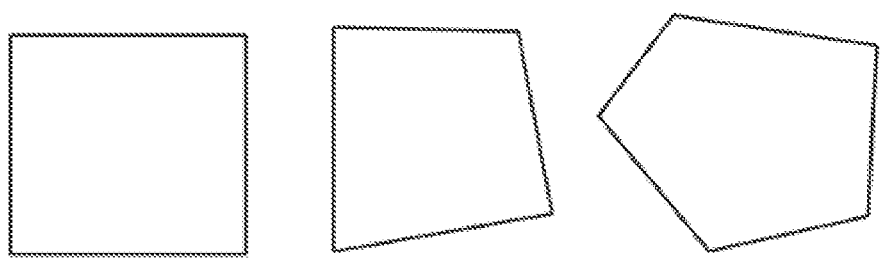
FIG. 7 shows examples of possible shapes of the top electrode.

The surface area of the embedded material M1; M2 and the top electrode 102 is determined by their shape in the radial plane. The shape of the embedded material M1; M2 is in one embodiment the same shape as the shape of the top electrode 102. The shape can be e.g. square, rectangle, trapezium, pentagon, or any other polygon shape. Three examples of possible shapes are shown in FIG. 7.

Figure 8:
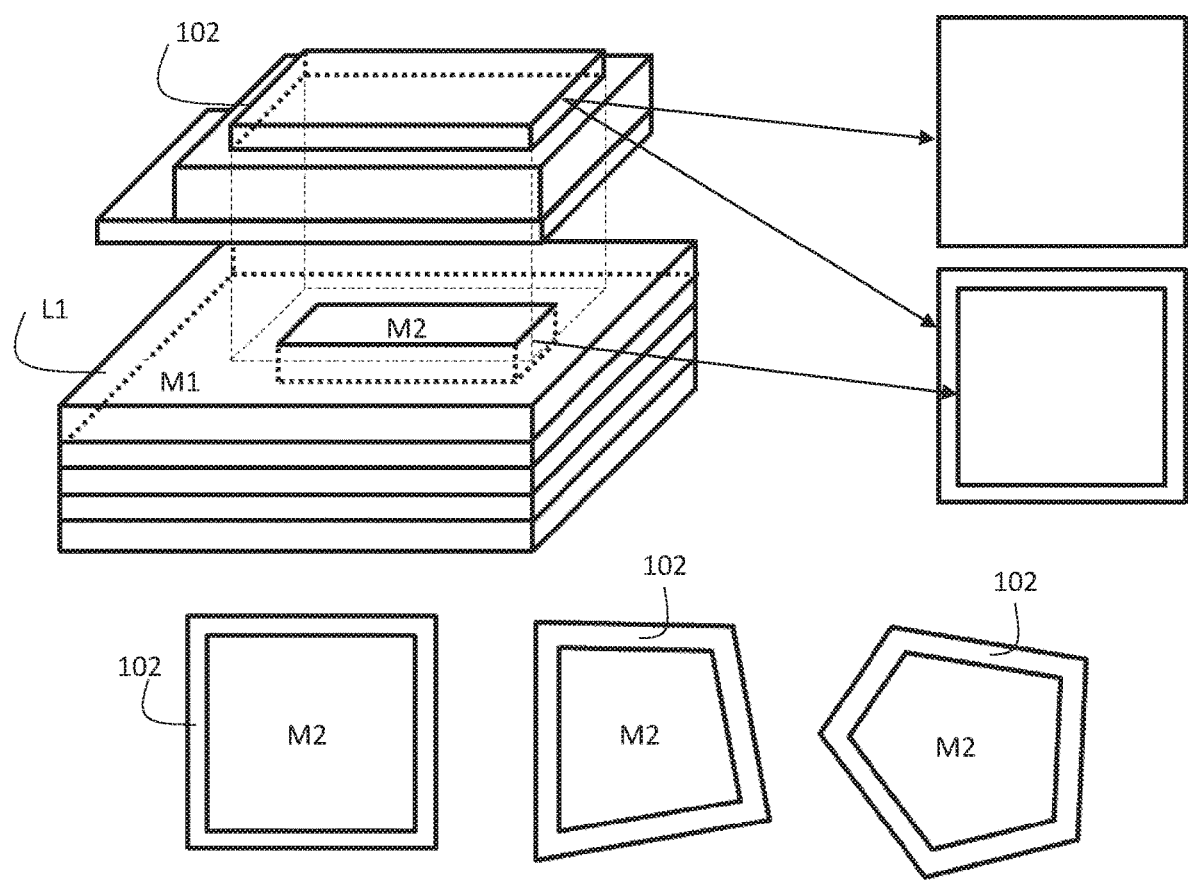
FIG. 8 shows the relationship between the surface area of the top electrode and the surface area of the embedded material for three different shapes.

FIG. 8 shows the relationship between the surface area of the embedded material M1; M2 and the surface area of the top electrode 102 for three different shapes. In FIG. 8 the surface areas of the embedded material M1; M2 are shown in one embodiment where the surface area of the embedded material M1; M2 is less than the surface area of the top electrode 102. When a square shape is used the surface area of the embedded material M1, M2 is preferably 82%-98% of the surface area of the top electrode 102. For other shapes, the surface area of the embedded material M1; M2 below the top electrode 102 is preferably 67%-96% of the surface area of the top electrode 102.

The first layer L1 in the Bragg mirror 108 enables cooling of the resonator 100 as well as temperature compensation in the resonator 100. Cooling of the resonator 100 is achieved by directing the transfer of heat energy via the metallic layers of the Bragg mirror 108 to the substrate 110. While further temperature compensation is achieved with the area of the embedded material M1; M2 which is selected to be a TCF material, e.g. $SiO_2$.

Figure 9:
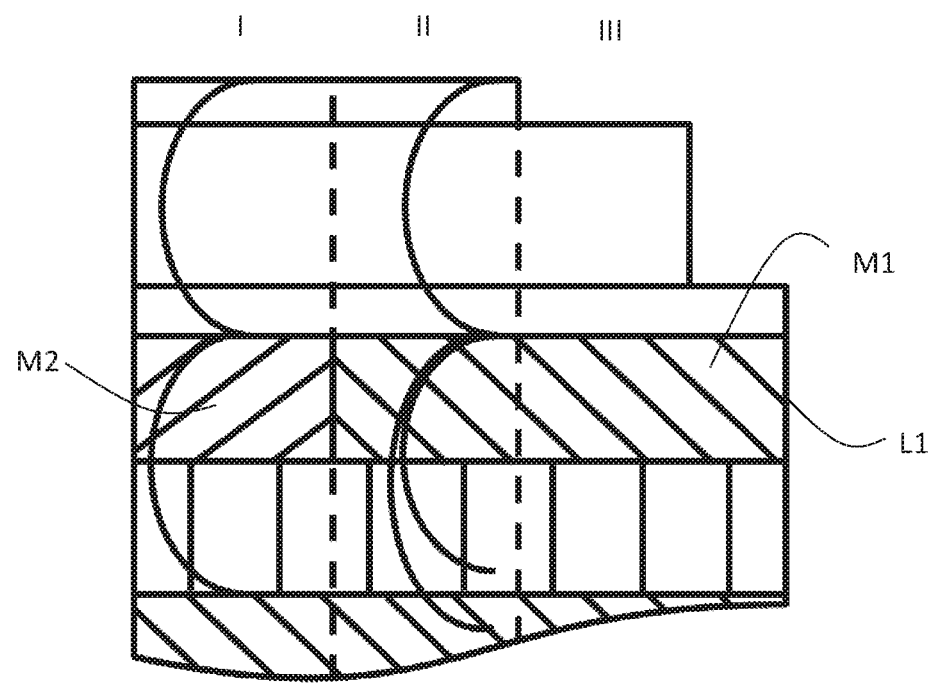
FIG. 9 shows a close up of the cross section of the resonator with stress distribution lines.

The first layer L1 in the Bragg mirror 108 also provides spurious resonance suppression. Spurious resonance suppression is achieved due to the different acoustic thickness in the different materials M1, M2 in the first layer L1. FIG. 9 shows two different areas I and II. In area I, the first layer L1 comprises the second material M2. In area II, the first layer L1 comprises the first material M1. As described earlier the first material M1 and the second material M2 have different acoustic velocities. The areas I and II will therefore have different acoustical thicknesses as illustrated by the stress distribution lines in FIG. 9. In FIG. 9 the layers in the Bragg mirror 108 have λ/4 thicknesses of the second material M2 in the area I. The λ/4 thickness is material dependent. λ/4 thickness is defined as longitudinal sound velocity in the material divided by four times the designed parallel resonance frequency. In other embodiments, the layer thicknesses in the Bragg mirror 108 may be another value than λ/4. With layers of λ/4 thickness of the second material M2, the stress distribution line in area I has its zero points at the borders between the layers in the Bragg mirror 108 to get the best possible reflection to the vibrations. However, in area II the acoustic thickness of the first material M1 is either larger or smaller than λ/4 and the stress distribution line therefore has its zero point above or below the borders between the layers. The acoustic layer thickness changes the resonance frequencies in area II to higher or lower frequencies than in the area I, respectively. This mismatch between the resonance frequencies in area I and area II hinders lateral waves to propagate into the area III, thereby reducing spurious resonances.

Simulations comparing the performance of the Bragg mirror 108 according to the disclosure with the performance of a conventional Bragg mirror have been performed. In the simulations, the active stack in the simulations consisted of molybdenum Mo electrodes and an aluminium nitride AlN piezoelectric layer. The λ/4 thicknesses of each material were applied in the Bragg mirrors.

In the thermal 2D simulations the temperature at the top electrode 102 was set to 323.15 K (+50° C.). This is approximately the temperature of the top electrode 102 induced by a low level signal (<20 dBm) driven into the resonator 100. The substrate temperature at 11 μm below the Bragg mirror 108 was set to room temperature and it worked as a reference temperature and a heat sink.

Samples in the simulations were provided with a conventional $SiO_2$/W Bragg mirror, with and without a first layer L1, and an Al/W Bragg mirror, with and without a first layer L1. In the samples with a first layer L1 according to the disclosure embedded Al and $SiO_2$ areas were used and positioned at the top of each Bragg mirror. In case of an embedded $SiO_2$ area, the rest of the first layer L1 consisted of Al. In case of an embedded Al area the rest of the first layer L1 consisted of $SiO_2$. Table I shows the measured average heat fluxes in the centre of the different samples.

TABLE I

Average heat flux values (in W/m²) of the resonators at the centre of the resonator.

| Bragg mirror | Pure Bragg mirror | Embedded Al, $SiO_2$ shoulders | Embedded $SiO_2$, Al shoulders |
|---|---|---|---|
| Al/W | 238e6 | 238e6 | 72.2e6 |
| $SiO_2$/W | 29.5e6 | 41.6e6 | 29.5e6 |

The simulations show that the pure Al/W Bragg and the Al/W Bragg mirror 108 with embedded Al in the first layer L1 have the highest heat fluxes. The average heat flux through the pure Al/W Bragg and the Al/W Bragg mirror 108 with embedded Al in the first layer L1 is eight times higher than the heat flux through the conventional $SiO_2$/W Bragg mirror. While the average heat flux through the Al/W Bragg mirror 108 with embedded $SiO_2$ in the first layer L1 is about two times higher than the heat flux through the conventional $SiO_2$/W Bragg mirror.

In 2D simulations the suppression of spurious resonances was noticed in all cases, were the first layer L1 was applied. In the simulations, the width of the embedded material Al/$SiO_2$ in the first layer L1 was varied from 60% width of the top electrode to the full length of the bottom electrode 106. In the simulations, the first layer L1 was positioned at the top of the Bragg mirror.

Figure 10A:
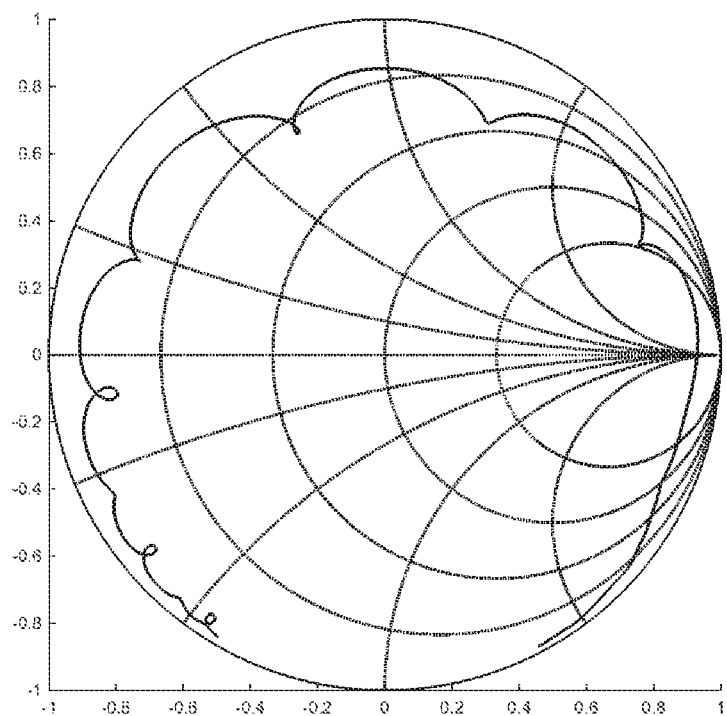
FIGS. 10a-10d shows Smith charts and phase responses of resonator simulations with a conventional Bragg mirror and with a Bragg mirror according to an example of the disclosure.
Figure 10B:
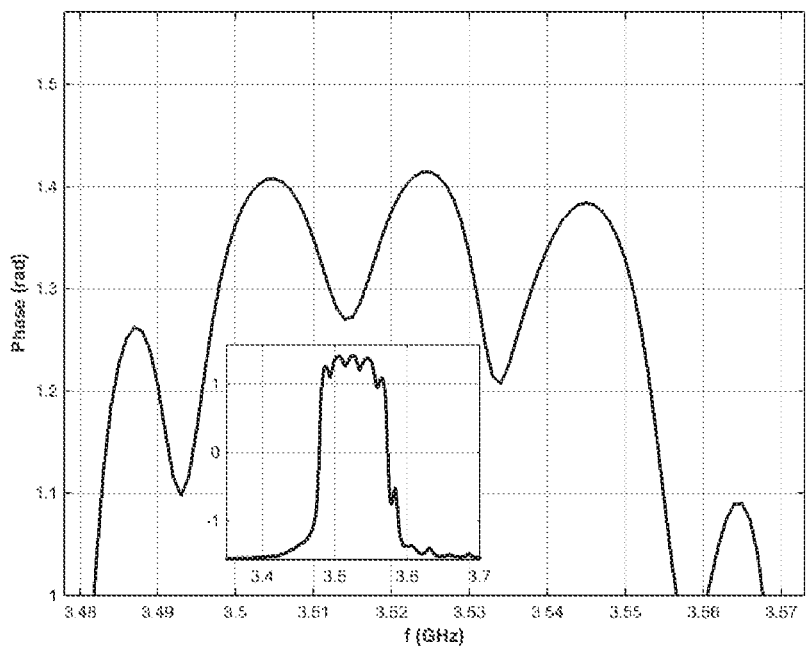
Figure 10C:
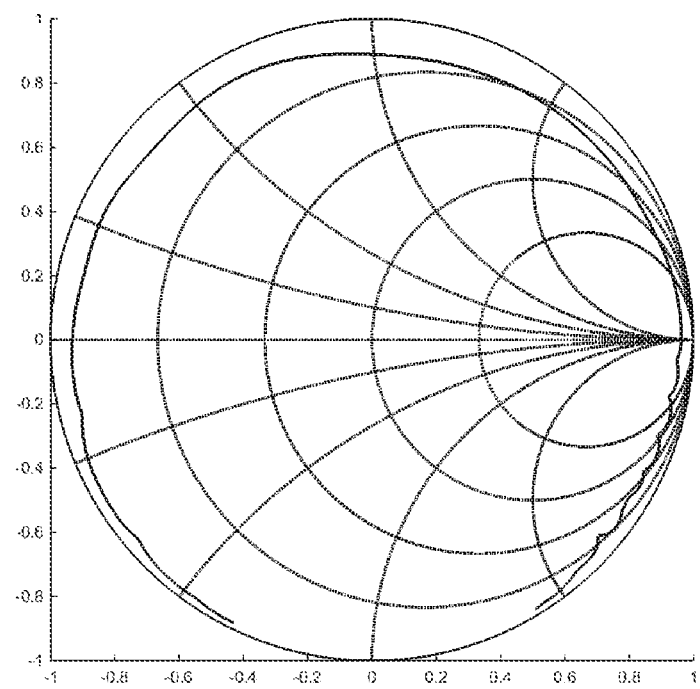
Figure 10D:
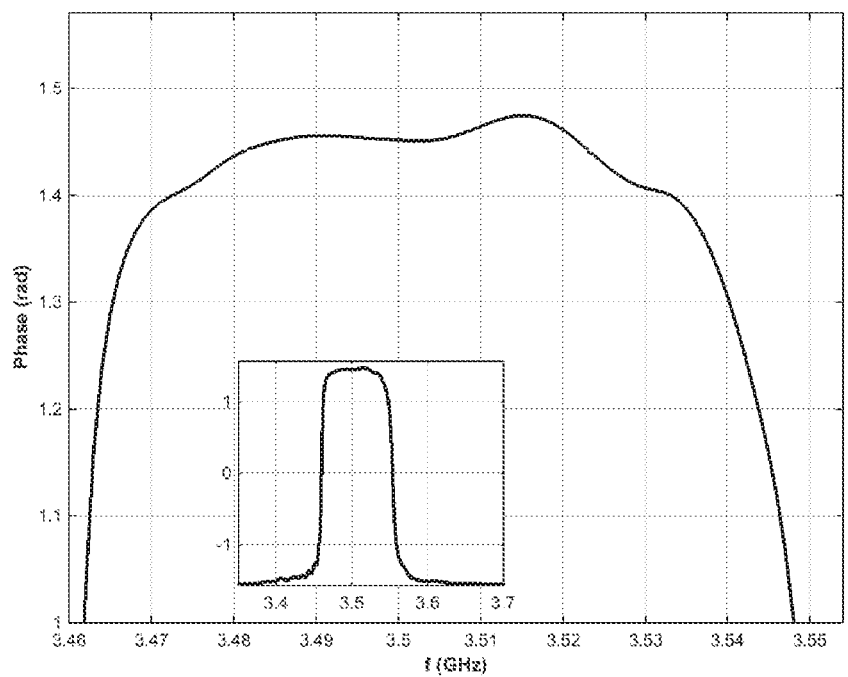

FIG. 10a shows the Smith chart and FIG. 10b shows the phase response of a resonator simulation without any first layer L1 in the Bragg mirror (the x-axis shows the frequency in GHz and the y-axis shows the phase in radians). The Bragg mirror stack consists of alternating Al and W layers. The spurious resonances are seen in resonance frequency region in both pictures. FIG. 10c shows the smith chart and FIG. 10d shows the phase response of the resonator with the first layer L1 with embedded area of $SiO_2$ in the first layer L1 of the Bragg mirror 108 (the x-axis shows the frequency in GHz and the y-axis shows the phase in radians). The width of the embedded $SiO_2$ area is 89% of the top electrode width.

The simulations show that with the Al/W Bragg mirror the spurious resonances appear strongly between series and parallel frequencies, see FIGS. 10a and 10b. Series resonance frequency is the frequency where the impedance response of the resonator has a local minimum, and the parallel resonance frequency is the frequency where the impedance response of the resonator has a local maximum. When the first layer L1 with the embedded $SiO_2$ area is added to the Bragg mirror 108 the spurious resonances at the same frequency region are suppressed tremendously, see FIGS. 10c and 10d. When the embedded $SiO_2$ area is close to the width of the top electrode 102 or the whole first layer L1 is of $SiO_2$ the spurious resonances appear at frequency region between series and parallel region. The strongest suppression for spurious resonances was achieved when the width of the embedded $SiO_2$ area was from 85%-95% of the width of the top electrode 102.

A concluding Table II shows selected parameters from the simulations. The $SiO_2$/W and the Al/W Bragg mirrors consisted of 2.5×$SiO_2$/W layers, i.e. $SiO_2$/W/$SiO_2$/W/$SiO_2$, and of 3.5×Al/W layers, i.e. Al/W/Al/W/Al/W/Al, respectively. All the layer structures resulted in about the same quality factor Q values in 1D simulation, where Q is defined as a derivative of the phase with respect to angular frequency:

$$Q_{s,p} = \left| \frac{\omega}{2} \frac{\partial \varphi}{\partial \omega} \right|_{f=fs,fp}$$

The $Q_s$ and $Q_p$ in Table II are Q values at series resonance frequency $f_s$ and parallel resonance frequency $f_p$, respectively. For comparison the simulation results of a resonator with an Al/W and a $SiO_2$/W Bragg mirror with a spurious suppression ring has been included into the Table II.

TABLE II

Selected parameters of the simulation results.

| Mirror (embedded layer) | Temperature drift | $Q_s$ | $Q_p$ | Temperature handling | Tolerance for triggering nonlinear response |
|---|---|---|---|---|---|
| Al/W | Good | 600 | 550 | Good | Good |
| Al/W ($SiO_2$) | Medium | 1050 | 700 | Medium | Medium/Good |
| Al/W (Al) | Good | 810 | 530 | Good | Good |
| Al/W with ring | Good | 360 | 690 | Good | Good |
| $SiO_2$/W | Poor | 900 | 700 | Poor | Poor |
| $SiO_2$/W ($SiO_2$) | Poor | 950 | 480 | Poor | Medium |
| $SiO_2$/W (Al) | Poor/Medium | 1050 | 500 | Poor/Medium | Medium |
| $SiO_2$/W with ring | Poor | 900 | 500 | Poor | Medium |

Though better temperature handling is achieved with the plain Al/W Bragg mirror, significantly better filter performance according to simulated Q values is achieved with the embedded SiO$_2$ layer in the Al/W Bragg mirror.

The tolerances for triggering the nonlinear response are here based on the temperature handling capacity of the layer stacks. The better the temperature handling capacity is the higher signal levels can be driven into the resonator and still receive linear response.

Finally, it should be understood that the disclosure is not limited to the embodiments described above, but also relates to and incorporates all embodiments within the scope of the appended independent claims.

What is claimed is:

1. A Bragg mirror comprising a stack of a plurality of layers arranged in an axial direction, wherein the plurality of layers comprises a first layer comprising, in a radial direction, a first material and a second material, wherein the first material is a first metal and the second material is a different material with respect to the first material, and wherein the first material is radially embedded by the second material in the first layer such that the first material forms an embedded material and the second material forms an embedding material, or whereing the second material is radially embedded by the first material in the first layer such that the second material forms the embedded material and the first material forms the embedding material,
wherein the plurality of layers further comprises:
a second layer comprising a third material; and
a third layer comprising the first material, and
wherein the third materail is a second metal.

2. The Bragg mirror according to claim 1, wherein a ratio of an acoustic velocity of the first material to an acoustic velocity of the second material is less than 0.94 or larger than 1.06.

3. The Bragg mirror according to claim 1, wherein a ratio of an acoustic impedance of the first material to an acoustic impedance of the second material is between 0.5 to 2.0.

4. The Bragg mirror according to claim 1, wherein the embedding material forms a loop surrounding the embedded material, and the embedded material forms a filling of the loop.

5. The Bragg mirror according to claim 1, wherein the first material is aluminium, the second material is silicon dioxide, and the third material is tungsten.

6. The Bragg mirror according to any of claim 1, wherein the plurality of layers comprises a plurality of said second layers and a plurality of said third layers, wherein the plurality of second layers and the plurality of third layers are alternatingly arranged in the stack.

7. The Bragg mirror according to claim 6, wherein the plurality of second layers and the plurality of third layers are alternatingly arranged below the first layer.

8. A resonator comprising:
a top electrode,
a bottom electrode,
a piezo electric layer arranged between the top electrode and the bottom electrode,
a substrate, and
a Bragg mirror arranged between the bottom electrode and the substrate,
a stack of a plurality of layers arranged in an axial direction, wherein the plurality of layers comprises:
a first layer comprising, in a radial direction, a first material and a second material, wherein the first material is a first metal and the second material is a different material with respect to the first material, and wherein the first material is radially embedded by the second material in the first layer such that the first material forms an embedded material and the second material forms an embedding material, or wherein the second material is radially embedded by the first material in the first layer such that the second material forms the embedded material and the first material forms the embedding material;
a second layer comprising a third material; and
a third layer comprising the first material,
wherein the plurality of layers comprises a plurality of said second layers and a plurality of said third layers, and
wherein the plurality of second layers and the plurality of third layers are alternatingly arranged in the stack.

9. The resonator according to claim 8, wherein the top electrode overlaps embedded material in the axial direction.

10. The resonator according to claim 8, wherein the bottom electrode abuts the embedded material.

11. The resonator according to any of claim 8, wherein a shape of the embedded material is the same shape as a shape of the top electrode.

12. The resonator according to any of claim 8, wherein a surface area of the embedded material is less than a surface area of the top electrode.

13. The resonator according to claim 12, wherein the surface area of the embedded material is between 67% to 98% of the surface area of the top electrode.

14. The resonator according to any of claim 8, wherein the top electrode, and the embedded material in the Bragg mirror are axially aligned relative to each other.

15. The resonator according to any of claim 8, wherein the bottom electrode abuts the first layer.

* * * * *

UNITED STATES PATENT AND TRADEMARK OFFICE
CERTIFICATE OF CORRECTION

PATENT NO. : 11,233,498 B2
APPLICATION NO. : 16/502932
DATED : January 25, 2022
INVENTOR(S) : Nurmela et al.

Page 1 of 1

It is certified that error appears in the above-identified patent and that said Letters Patent is hereby corrected as shown below:

In the Claims

Claim 1: Column 13, Line 22: "rail, or whereing the second material is radially embedded" should read -- rail, or wherein the second material is radially embedded --.

Claim 1: Column 13, Line 29: "wherein the third materail is a second metal." should read -- wherein the third material is a second metal. --.

Claim 6: Column 13, Line 44: "The Bragg mirror according to any of claim 1, wherein" should read -- The Bragg mirror according to claim 1, wherein --.

Claim 8: Column 14, Lines 2-6:
"a top electrode,
a bottom electrode,
a piezo electric layer arranged between the top electrode
and the bottom electrode,
a substrate, and" should read
-- a top electrode;
a bottom electrode;
a piezo electric layer arranged between the top electrode
and the bottom electrode;
a substrate; and --.

Claim 9: Column 14, Line 33: "electrode overlaps embedded material in the axial direction." should read -- electrode overlaps the embedded material in the axial direction. --.

Signed and Sealed this
Twenty-first Day of June, 2022

Katherine Kelly Vidal
*Director of the United States Patent and Trademark Office*